(12) United States Patent
Jiang

(10) Patent No.: US 11,171,069 B1
(45) Date of Patent: Nov. 9, 2021

(54) DISPLAY MODULE, MANUFACTURING METHOD THEREOF AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Guoqiang Jiang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 556 days.

(21) Appl. No.: 16/316,799

(22) PCT Filed: Dec. 19, 2018

(86) PCT No.: PCT/CN2018/122202
§ 371 (c)(1),
(2) Date: Jan. 10, 2019

(87) PCT Pub. No.: WO2020/062630
PCT Pub. Date: Apr. 2, 2020

(30) Foreign Application Priority Data

Sep. 27, 2018 (CN) .......................... 201811134413.3

(51) Int. Cl.
*H01L 23/31* (2006.01)
*H01L 21/56* (2006.01)
*G02F 1/1345* (2006.01)
*H01L 25/18* (2006.01)

(52) U.S. Cl.
CPC .......... *H01L 23/3135* (2013.01); *H01L 21/56* (2013.01); *G02F 1/13452* (2013.01); *H01L 25/18* (2013.01)

(58) Field of Classification Search
CPC ..... H01L 23/3135; H01L 21/56; H01L 25/18; G02F 1/13452
See application file for complete search history.

(56) References Cited

U.S. PATENT DOCUMENTS 9,917,276 B2 * 3/2018 Hwang ............... G02F 1/13306
10,770,688 B2 * 9/2020 Um ...................... H01L 27/323
2018/0088387 A1 * 3/2018 Enami ................. G02F 1/13458
(Continued)

FOREIGN PATENT DOCUMENTS

CN          1477422 A      2/2004
CN        101344656 A      1/2009
(Continued)

*Primary Examiner* — Nicholas J Tobergte
(74) *Attorney, Agent, or Firm* — Osha Bergman Watanabe & Burton LLP

(57) ABSTRACT

A display module and a method of manufacturing the display module are provided. The display module comprises a display panel, a driving integrated circuit on the display panel, and a protective tape on the driving integrated circuit. The protective tape includes a second adhesive material on the driving integrated circuit, and an adhesive tape on the second adhesive material. The second adhesive material fills an area between the adhesive tape and the display panel.

20 Claims, 3 Drawing Sheets

(56) References Cited

U.S. PATENT DOCUMENTS

2019/0036074 A1* 1/2019 You .................... H01L 51/5246
2021/0247649 A1* 8/2021 Takabayashi ..... G02F 1/133308

FOREIGN PATENT DOCUMENTS

| CN | 204705799 U | 10/2015 |
| CN | 206863396 U | 1/2018 |
| JP | H04208924 A | 7/1992 |
| KR | 20180054335 A | 5/2018 |

\* cited by examiner

DISPLAY MODULE, MANUFACTURING METHOD THEREOF AND ELECTRONIC DEVICE

BACKGROUND

1. Field of the Invention

The present disclosure relates to the field of panel manufacturing, more particularly, to a display module, a manufacturing method thereof and an electronic device.

2. Description of the Related Art

With the rapid development of display technology, flexible displays have gradually become the mainstream. Common display screens include liquid crystal displays (LCD) and organic light-emitting diode (OLED) displays.

In the related art, a display screen comprises a display panel, and a bonding area of the driving integrated circuit (IC) is disposed at one end of the display panel. In order to avoid undesirable phenomena, such as electrostatic breakdown, scratching, or moisture intrusion, etc., of the driving IC during subsequent processes, a protective tape is usually disposed on the driving IC. However, the height differences of the driving IC on the bonding area of make the protective tape in the related art unable to closely adhere the driving IC, and the moisture in the air easily enters the driving IC, which affects the quality of the display screen.

Therefore, there is a need to provide a display module to resolve the above-mentioned problem.

SUMMARY

The present disclosure provides a display module, a manufacturing method thereof, and an electronic device to resolve the technical problem that the driving IC of the display module in the related art tends to be eroded by external water and oxygen.

The present disclosure provides a display module. The display module comprises a display panel, a driving integrated circuit on the display panel, and a protective tape on the driving integrated circuit. The protective tape includes a second adhesive material on the driving integrated circuit, and an adhesive tape on the second adhesive material. The second adhesive material fills an area between the adhesive tape and the display panel.

According to an embodiment of the present disclosure, the display panel comprises a bonding area close to an edge area of the display panel, the driving integrated circuit is disposed in the bonding area.

According to an embodiment of the present disclosure, the second adhesive material comprises an optical clear adhesive, the adhesive tape comprises an inorganic material.

According to an embodiment of the present disclosure, an orthogonal projection of the second adhesive material on the adhesive tape is on the adhesive tape, and the adhesive tape is connected to the display panel.

According to an embodiment of the present disclosure, the second adhesive material is formed from a first adhesive material through a predetermined process, and a thickness of the first adhesive material is from 140 micrometers to 160 micrometers.

According to an embodiment of the present disclosure, the first adhesive material is placed in a high temperature furnace and expands to fill the area between the adhesive tape and the display panel though a heating process to form the second adhesive material.

According to an embodiment of the present disclosure, a heating temperature of the high temperature furnace is from 60° C. to 80° C.

The present disclosure also provides a method of manufacturing a display module. The method includes providing a display panel, disposing a driving integrated circuit on the display panel, attaching a protective tape to the driving integrated circuit, so that the protective tape covers the driving integrated circuit, the protective tape comprising a first adhesive material and an adhesive tape on the first adhesive material, and utilizing a predetermined process so that the first adhesive material forms the second adhesive material. The second adhesive material fills an area between the adhesive tape and the display panel.

According to an embodiment of the present disclosure, the display panel comprises a bonding area close to an edge area of the display panel, the driving integrated circuit is disposed in the bonding area.

According to an embodiment of the present disclosure, the second adhesive material comprises an optical clear adhesive, the adhesive tape comprises an inorganic material.

According to an embodiment of the present disclosure, an orthogonal projection of the second adhesive material on the adhesive tape is on the adhesive tape, and the adhesive tape is connected to the display panel.

According to an embodiment of the present disclosure, a thickness of the first adhesive material is from 140 micrometers to 160 micrometers.

According to an embodiment of the present disclosure, the step of utilizing the predetermined process so that the first adhesive material forms the second adhesive material comprises: placing the first adhesive material in a high temperature furnace, the first adhesive material being heated and expanding to fill the area between the adhesive tape and the display panel to form the second adhesive material. A heating temperature of the high temperature furnace is from 60° C. to 80° C.

The present disclosure also provides an electronic device that includes a backlight module and a display module. The display module comprises a display panel, a driving integrated circuit on the display panel, and a protective tape on the driving integrated circuit. The protective tape includes a second adhesive material on the driving integrated circuit, and an adhesive tape on the second adhesive material.

The second adhesive material fills an area between the adhesive tape and the display panel.

According to an embodiment of the present disclosure, the display panel comprises a bonding area close to an edge area of the display panel, the driving integrated circuit is disposed in the bonding area.

According to an embodiment of the present disclosure, the second adhesive material comprises an optical clear adhesive, the adhesive tape comprises an inorganic material.

According to an embodiment of the present disclosure, an orthogonal projection of the second adhesive material on the adhesive tape is on the adhesive tape, and the adhesive tape is connected to the display panel.

According to an embodiment of the present disclosure, the second adhesive material is formed from a first adhesive material through a predetermined process, and wherein a thickness of the first adhesive material is from 140 micrometers to 160 micrometers.

According to an embodiment of the present disclosure, the first adhesive material is placed in a high temperature furnace and expands to fill the area between the adhesive tape and the display panel though a heating process to form the second adhesive material.

According to an embodiment of the present disclosure, a heating temperature of the high temperature furnace is from 60° C. to 80° C.

The advantageous effects are as follows: the present disclosure disposes the protective tape on the driving IC. The second adhesive material in the protective tape fills the area between the adhesive tape and the display panel, and the adhesive tape is connected to the display panel. As a result, the driving IC is completely covered by the protective tape to prevent the erosion of the driving IC by external water and oxygen, thus improving the quality of the display screen.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
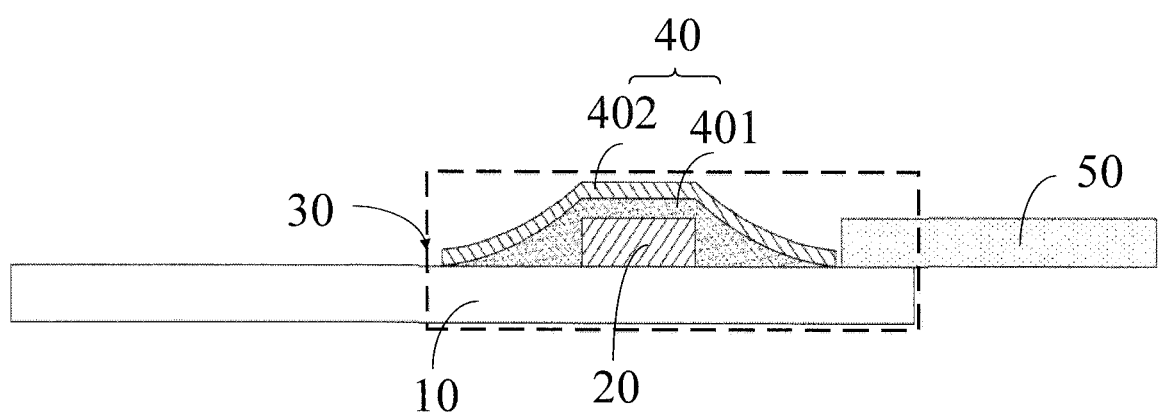
FIG. 1 is a structural diagram of film layers of a display module according to the present disclosure.

A description is provided with reference to FIG. 1. FIG. 1 is a structural diagram of a display module according to the present disclosure.

The display module comprises a display panel 10 and a driving IC 20 on the display panel 10.

In one embodiment, the display panel 10 constituting the display module is not limited to the OLED display panel of the present disclosure, and may be an LCD panel or other types of display panels.

In one embodiment, the display panel 10 may be a rigid display panel or a flexible display panel, and the present disclosure is not limited in this regard.

The display panel 10 comprises a bonding area 30 close to an edge area of the display panel 10. The bonding area 30 may be on an upper side or a lower side of the display panel 10, and the present disclosure is not limited in this regard.

The driving IC 20 is disposed in the bonding area 30.

The display module further comprises a protective tape 40 on the driving IC 20.

The protective tape 40 comprises a second adhesive material 401 and an adhesive tape 402. The second adhesive material 401 is on the driving IC 20, and the adhesive tape 402 is on the second adhesive material 401.

In one embodiment, the second adhesive material 401 fills an area between the adhesive tape 402 and the display panel 10.

Figure 2:
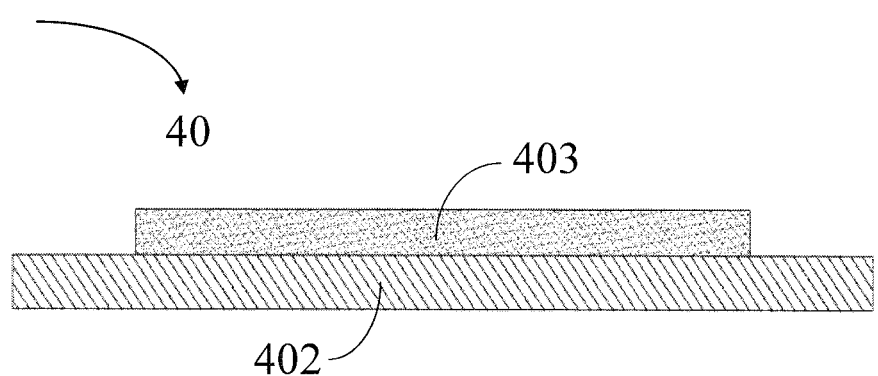
FIG. 2 is a structural diagram of a protective tape of a display module according the present disclosure.

A description is provided with reference to FIG. 2. FIG. 2 is a structural diagram of a protective tape of a display module according the present disclosure.

The protective tape 40 in the related art only comprises a first adhesive material 403 and the adhesive tape 402.

According to the embodiment of the present disclosure, the display panel 10 is placed in a high temperature furnace after the protective tape 40 covers the driving IC 20, so that the first adhesive material 403 expands into the second adhesive material 401 filling the area between the adhesive tape 402 and the display panel 10.

In one embodiment, a heating temperature of the high temperature furnace is from 60° C. to 80° C.

In one embodiment, the first adhesive material 403 or the second adhesive material 401 may be but not limited to an optical clear adhesive (OCA). The OCA is a colorless, transparent adhesive material having a light transmittance of 90% or more and a good bonding strength, and can be cured at room temperature or medium temperature. The OCA selected in the present disclosure is a high-flow adhesive material, which expands after being heated in the high-temperature furnace to fill the area between the adhesive tape 402 and the display panel 10. The adhesive material can improve the hardness of an area where the driving IC 20 is located after being cooled and cured and improve the pressure resistance of the area where the driving IC 20 is located.

In one embodiment, a thickness of the first adhesive material 403 is from 140 micrometers to 160 micrometers, which is much greater than the thickness of 20 micrometers in the related art.

In one embodiment, the adhesive tape 402 of the protective tape 40 may be but not limited to being made of an inorganic material. The adhesive tape 402 is mainly used to block water and oxygen from entering into the OCA, which in turn erodes the driving IC 20 and affects the quality of the display module.

A description is provided with reference to FIG. 1 or FIG. 2. An orthogonal projection of the first adhesive material 403 or the second adhesive material 401 on the adhesive tape 402 is on the adhesive tape 402. The adhesive tape 402 is connected to the display panel 10.

In one embodiment, an area of the adhesive tape 402 is larger than an area of the first adhesive material 403 or the second adhesive material 401. In the attach process, the adhesive tape 402 completely covers the first adhesive material 403 or the second adhesive material 401 to prevent the first adhesive material 403 or the second adhesive material 401 from being exposed to the air and in contact with water and oxygen in the air. The contact of the driving IC 20 with water and oxygen is further isolated.

The display module further comprises a flexible circuit board 50 disposed in the bonding area 30 configured to transmit the control signal in the display module.

The display module further comprises a touch layer, a polarizer layer and a cover layer on the display panel 10. The display panel 10 is bonded to the touch layer through a first OCA layer, and the polarizer layer is bonded to the cover layer through a second OCA layer.

In one embodiment, the protective tape 40 is disposed on the driving IC 20 according to the present disclosure. The second adhesive material 401 in the protective tape 40 fills the area between the adhesive tape 402 and the display panel 10, and the adhesive tape 402 is connected to the display panel 10. As a result, the driving IC is completely covered by the protective tape 40 to prevent the erosion of the driving IC by external water and oxygen, thus improving the quality of the display screen.

Figure 3:
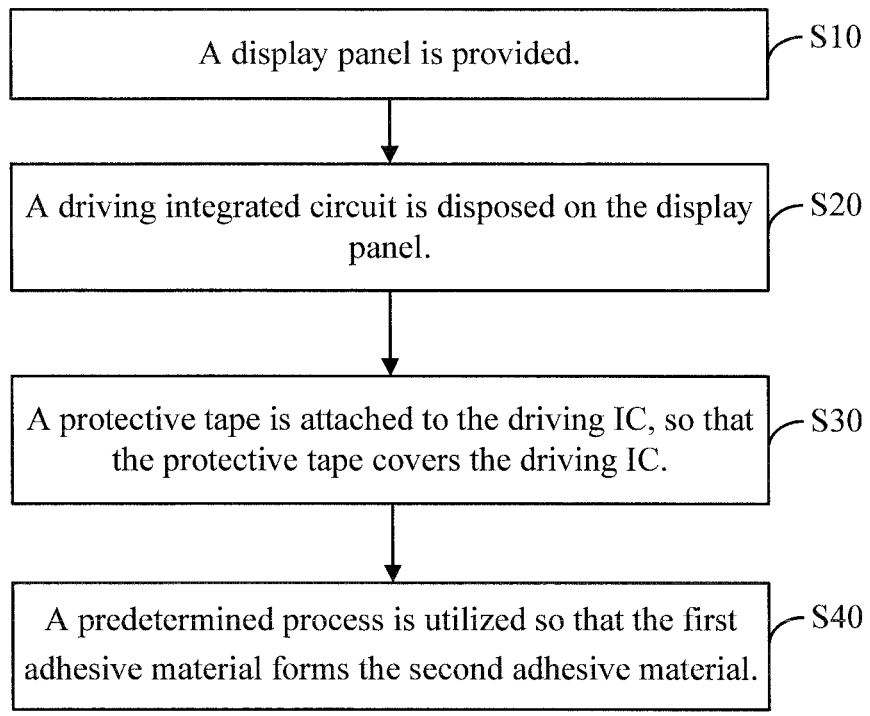
FIG. 3 is a step diagram of a method of manufacturing a display module according to the present disclosure.

A description is provided with reference to FIG. 3. FIG. 3 is a step diagram of a manufacturing method of a display module according to the present disclosure.

The manufacturing method comprises:

S10: a display panel is provided.

In this step, the display panel 10 of the display module provided is not limited to the OLED display panel of the present disclosure, and may be an LCD panel or other types of display panels.

In one embodiment, the display panel 10 may be a rigid display panel or a flexible display panel, and the present disclosure is not limited in this regard.

S20: a driving integrated circuit (IC) is disposed on the display panel.

In this step, the display panel 10 comprises a bonding area 30 close to an edge area of the display panel 10. The bonding area 30 may be on an upper side or a lower side of the display panel 10, and the present disclosure is not limited in this regard.

Figure 4:
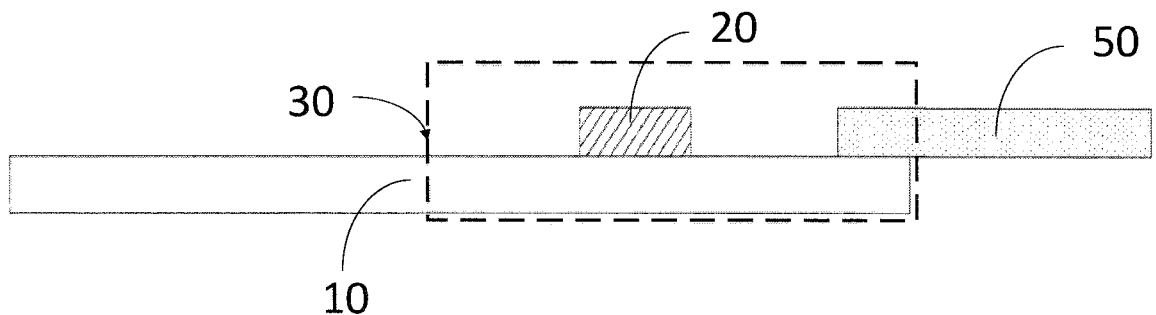
FIG. 4 is a first process diagram of a method of manufacturing a display module of the present disclosure.

A description is provided with reference to FIG. 4. FIG. 4 is a first process diagram of a manufacturing method of a display module of the present disclosure.

The driving IC 20 is disposed on the bonding area 30. The bonding area 30 further comprises a flexible circuit board 50 disposed closely adjacent to the driving IC 20.

S30: a protective tape is attached to the driving IC, so that the protective tape covers the driving IC.

Figure 5:
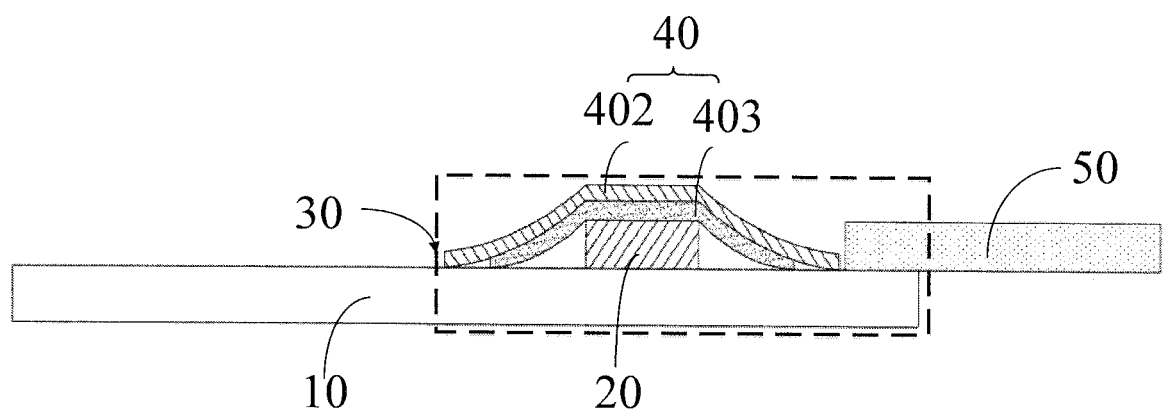
FIG. 5 is a second process diagram of a method of manufacturing a display module of the present disclosure.

A description is provided with reference to FIG. 5. FIG. 5 is a second process diagram of a manufacturing method of a display module of the present disclosure.

The protective tape 40 comprises the first adhesive material 403 and the adhesive tape 402 on the first adhesive material 403. The first adhesive material 403 and the adhesive tape 402 cover the driving IC 20.

S40: a predetermined process is utilized so that the first adhesive material forms the second adhesive material.

In this step, a pattern shown in FIG. 1 is finally formed.

In one embodiment, the predetermined process is a heating process.

The display panel 10 is placed in a high temperature furnace, so that the first adhesive material 403 expands into the second adhesive material 401 filling the area between the adhesive tape 402 and the display panel 10.

In one embodiment, a heating temperature of the high temperature furnace is from 60° C. to 80° C.

In one embodiment, the first adhesive material 403 or the second adhesive material 401 may be but not limited to an OCA. The OCA is a colorless, transparent adhesive material having a light transmittance of 90% or more and a good bonding strength, and can be cured at room temperature or medium temperature. The OCA selected in the present disclosure is a high-flow adhesive material, which expands after being heated in the high-temperature furnace to fill the area between the adhesive tape 402 and the display panel 10. The adhesive material can improve the hardness of an area where the driving IC 20 is located after being cooled and cured and improve the pressure resistance of the area where the driving IC 20 is located.

In one embodiment, a thickness of the first adhesive material 403 is from 140 micrometers to 160 micrometers, which is much greater than the thickness of 20 micrometers in the related art.

In one embodiment, the adhesive tape 402 of the protective tape 40 may be but not limited to being made of an inorganic material. The adhesive tape 402 is used to block water and oxygen from entering into the OCA, which in turn erodes the driving IC 20 and affects the quality of the display module.

A description is provided with reference to FIG. 1 or FIG. 2. An orthogonal projection of the first adhesive material 403 or the second adhesive material 401 on the adhesive tape 402 is on the adhesive tape 402. The adhesive tape 402 is connected to the display panel 10.

That is, the area of the adhesive tape 402 is larger than the area of the first adhesive material 403 or the second adhesive material 401. In the attach process, the adhesive tape 402 completely covers the first adhesive material 403 or the second adhesive material 401 to prevent the first adhesive material 403 or the second adhesive material 401 from being exposed to the air and in contact with water and oxygen in the air. The contact of the driving IC 20 with water and oxygen is further isolated.

The present disclosure further provides an electronic device. The electronic device comprises the above display module, and the working principle of the electronic device is similar to that of the display module, and a description in this regard is not provided. The electronic device according to the present disclosure comprises, but not limited to, a mobile phone, a tablet computer, a computer display, a game console, a television, a display screen, a wearable device, or some other daily electrical device or household appliance having a display function.

The present disclosure provides a display module and a method of manufacturing the display module. The display module comprises a display panel, a driving integrated circuit on the display panel, and a protective tape on the driving integrated circuit. The protective tape includes a second adhesive material on the driving integrated circuit, and an adhesive tape on the second adhesive material. The second adhesive material fills an area between the adhesive tape and the display panel. The present disclosure disposes the protective tape on the driving IC. The second adhesive material in the protective tape fills the area between the adhesive tape and the display panel, and the adhesive tape is connected to the display panel. As a result, the driving IC is completely covered by the protective tape to prevent the erosion of the driving IC by external water and oxygen, thus improving the quality of the display screen.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A display module comprising:
  a display panel;
  a driving integrated circuit on the display panel; and
  a protective tape on the driving integrated circuit comprising:
    a second adhesive material on the driving integrated circuit; and
    an adhesive tape on the second adhesive material;
    wherein the second adhesive material fills an area between the adhesive tape and the display panel.

2. The display module as claimed in claim 1, wherein the display panel comprises a bonding area close to an edge area of the display panel, the driving integrated circuit is disposed in the bonding area.

3. The display module as claimed in claim 1, wherein the second adhesive material comprises an optical clear adhesive, the adhesive tape comprises an inorganic material.

4. The display module as claimed in claim 1, wherein an orthogonal projection of the second adhesive material on the adhesive tape is on the adhesive tape, and the adhesive tape is connected to the display panel.

5. The display module as claimed in claim 1, wherein the second adhesive material is formed from a first adhesive material through a predetermined process, and wherein a thickness of the first adhesive material is from 140 micrometers to 160 micrometers.

6. The display module as claimed in claim 5, wherein the first adhesive material is placed in a high temperature furnace and expands to fill the area between the adhesive tape and the display panel though a heating process to form the second adhesive material.

7. The display module as claimed in claim 6, wherein a heating temperature of the high temperature furnace is from 60° C. to 80° C.

8. A method of manufacturing a display module comprising:
providing a display panel;
disposing a driving integrated circuit on the display panel;
attaching a protective tape to the driving integrated circuit, so that the protective tape covers the driving integrated circuit, the protective tape comprising a first adhesive material and an adhesive tape on the first adhesive material; and
utilizing a predetermined process so that the first adhesive material forms the second adhesive material;
wherein the second adhesive material fills an area between the adhesive tape and the display panel.

9. The method as claimed in claim 8, wherein the display panel comprises a bonding area close to an edge area of the display panel, the driving integrated circuit is disposed in the bonding area.

10. The method as claimed in claim 8, wherein the second adhesive material comprises an optical clear adhesive, the adhesive tape comprises an inorganic material.

11. The method as claimed in claim 8, wherein an orthogonal projection of the second adhesive material on the adhesive tape is on the adhesive tape, and the adhesive tape is connected to the display panel.

12. The method as claimed in claim 8, wherein a thickness of the first adhesive material is from 140 micrometers to 160 micrometers.

13. The method as claimed in claim 8, wherein the step of utilizing the predetermined process so that the first adhesive material forms the second adhesive material comprises:
placing the first adhesive material in a high temperature furnace, the first adhesive material being heated and expanding to fill the area between the adhesive tape and the display panel to form the second adhesive material,
wherein a heating temperature of the high temperature furnace is from 60° C. to 80° C.

14. An electronic device comprising:
a backlight module; and
a display module, comprising:
a display panel;
a driving integrated circuit on the display panel; and
a protective tape on the driving integrated circuit comprising:
a second adhesive material on the driving integrated circuit; and
an adhesive tape on the second adhesive material;
wherein the second adhesive material fills an area between the adhesive tape and the display panel.

15. The electronic device as claimed in claim 14, wherein the display panel comprises a bonding area close to an edge area of the display panel, the driving integrated circuit is disposed in the bonding area.

16. The electronic device as claimed in claim 14, wherein the second adhesive material comprises an optical clear adhesive, the adhesive tape comprises an inorganic material.

17. The electronic device as claimed in claim 14, wherein an orthogonal projection of the second adhesive material on the adhesive tape is on the adhesive tape, and the adhesive tape is connected to the display panel.

18. The electronic device as claimed in claim 14, wherein the second adhesive material is formed from a first adhesive material through a predetermined process, and wherein a thickness of the first adhesive material is from 140 micrometers to 160 micrometers.

19. The electronic device as claimed in claim 18, wherein the first adhesive material is placed in a high temperature furnace and expands to fill the area between the adhesive tape and the display panel though a heating process to form the second adhesive material.

20. The electronic device as claimed in claim 19, wherein a heating temperature of the high temperature furnace is from 60° C. to 80° C.

\* \* \* \* \*